United States Patent
Zhai et al.

(10) Patent No.: US 10,468,632 B2
(45) Date of Patent: Nov. 5, 2019

(54) ORGANIC LIGHT-EMITTING DISPLAY PANEL AND ORGANIC LIGHT-EMITTING DISPLAY DEVICE

(71) Applicant: SHANGHAI TIANMA MICRO-ELECTRONICS CO., LTD., Shanghai (CN)

(72) Inventors: Yingteng Zhai, Shanghai (CN); Haijing Chen, Shanghai (CN); Zhenying Li, Shanghai (CN); Jun Ma, Shanghai (CN)

(73) Assignee: SHANGHAI TIANMA MICRO-ELECTRONICS CO., LTD., Shanghai (CN)

(*) Notice: Subject to any disclaimer, the term of this patent is extended or adjusted under 35 U.S.C. 154(b) by 0 days.

(21) Appl. No.: 15/945,417

(22) Filed: Apr. 4, 2018

(65) Prior Publication Data
US 2019/0067643 A1     Feb. 28, 2019

(30) Foreign Application Priority Data
Aug. 29, 2017 (CN) .......................... 2017 1 0755058

(51) Int. Cl.
*H01L 51/52* (2006.01)
*H01L 27/32* (2006.01)

(52) U.S. Cl.
CPC ...... *H01L 51/5268* (2013.01); *H01L 27/3258* (2013.01); *H01L 51/5253* (2013.01);
(Continued)

(58) Field of Classification Search
CPC ............. H01L 51/5268; H01L 51/5256; H01L 27/3258; H01L 27/3211
(Continued)

(56) References Cited

U.S. PATENT DOCUMENTS 9,182,631 B2 * 11/2015 Iwata ................... H01L 51/5268
9,512,976 B2 * 12/2016 Bessho ................ G02B 5/0242
(Continued)

FOREIGN PATENT DOCUMENTS

CN         2862332 Y    1/2007
CN     101276009 A    10/2008
(Continued)

OTHER PUBLICATIONS

CN Application 201710755058.0, 1st Office Action dated Oct. 25, 2018.

*Primary Examiner* — Karen Kusumakar
*Assistant Examiner* — Adam S Bowen
(74) *Attorney, Agent, or Firm* — Alston & Bird LLP

(57) ABSTRACT

An organic light-emitting display panel, includes an array substrate including a flexible substrate and a thin film transistor layer placed on the flexible substrate; an organic light-emitting component placed on the array substrate, including a plurality of light-emitting units; a packaging layer placed on aside of the organic light-emitting component away from the array substrate, the packaging layer including a first inorganic packaging layer and a first organic packaging layer, the first inorganic packaging layer and the first organic packaging layer being placed in order on a side of the packaging layer along a direction away from the array substrate; wherein the first organic packaging layer includes a plurality of scattering particles, refractive indexes of the first inorganic packaging layer, the first organic packaging layer and the scattering particle are defined as n1, n2 and n3 respectively, and n2 is different from n3.

20 Claims, 11 Drawing Sheets

(52) U.S. Cl.
CPC ...... *H01L 51/5256* (2013.01); *H01L 27/3211* (2013.01); *H01L 27/3244* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2012/0256218 | A1* | 10/2012 | Kwack | H01L 51/5256 257/98 |
| 2013/0168712 | A1* | 7/2013 | Jeong | H01L 51/5275 257/98 |
| 2016/0379964 | A1* | 12/2016 | Wang | H01L 33/60 257/89 |

FOREIGN PATENT DOCUMENTS

| | | |
|---|---|---|
| CN | 102738403 A | 10/2012 |
| CN | 103928594 A | 7/2014 |
| CN | 103187536 B | 3/2017 |

* cited by examiner

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims the benefit of priority to Chinese Patent Application No. CN201710755058.0, filed on Aug. 29, 2017, the content of which is incorporated herein by reference in its entirety.

TECHNICAL FIELD

The present disclosure relates to the field of display technologies and, particularly, to an organic light-emitting display panel and a display device including the same.

BACKGROUND

With the development of the display technologies, the process of making a display panel is maturing. Currently, the display panel generally includes an organic light-emitting diode (OLED) display panel, or a liquid crystal display (LCD) panel, or a plasma display panel (PDP). As a self-luminous display device, an OLED display device does not need independent separate light source. Thus, an OLED display device can be operated at a low voltage, and be made light and thin. An OLDE display device has excellent properties, such as wide viewing angle, high contrast, quick response, and so on. Therefore, as a next-generation display device, the OLED display device has attracted attentions.

An OLED display panel includes, in part, an array substrate, an organic light-emitting component, and a packaging layer. The packaging layer enables the organic light-emitting component packaged in a sealed space, thereby prevents moisture and oxygen from diffusing into the organic light-emitting component there by affecting the performance of the organic light-emitting component. The packaging layer generally includes a first inorganic packaging layer, an organic packaging layer, and a second inorganic packaging layer. The first inorganic packaging layer is usually made of metal oxides or nitrides, such as aluminum oxide, silicon nitride, and on the like. A refractive index of aluminum oxide is about 1.765, and a refractive index of silicon nitride is about 2.300. The organic packaging layer is usually made of organic compounds, such as acrylic resin and epoxy resin. Refractive indexes of acrylic resin and epoxy resin are about 1.5. Since the refractive index of the first inorganic packaging layer is greater than the refractive index of the organic packaging layer, when the light emitted from the organic light-emitting component enters into the organic packaging layer via the first inorganic packaging layer with an incident angle$\sigma 1$, that is, when the light passes from an optically denser medium to an optically thinner medium, the emerging angle$\sigma 2$ is greater than the incident angle$\sigma 1$, thus causing the light to be refracted with a larger angle. Thus, light from one light-emitting medium may easily enter into another light-emitting unit adjacent to the light-emitting medium. The refractive index of the first inorganic packaging layer is referred to as$n1'$, and the refractive index of the organic packaging layer is referred to as $n2'$. When $\sigma 1 \geq arc \sin (n2'/n1')$, at a total reflection) ($\sigma 2=90°$), will happen, which affects luminous efficiency and then affects the display performance.

SUMMARY

In viewing of the above, the present disclosure provides, in part, two kinds of organic light-emitting display panels and display devices including the two kinds of organic light-emitting display panels, so as to improve display effect.

In a first aspect, the present disclosure provides an organic light-emitting display panel, including: an array substrate, including a flexible substrate and a thin film transistor layer placed on the flexible substrate; an organic light-emitting component placed on the array substrate, the organic light-emitting component including a plurality of light-emitting units; and a packaging layer placed on a side of the organic light-emitting component away from the array substrate, the packaging layer at least including a first inorganic packaging layer and a first organic packaging layer, the first inorganic packaging layer and the first organic packaging layer being placed in order on a side of the packaging layer along a direction away from the array substrate; wherein the first organic packaging layer includes a plurality of scattering particles, a refractive index of the first inorganic packaging layer is defined as n1, a refractive index of the first organic packaging layer is defined as n2, a refractive index of the scattering particle is defined as n3, and n2 is different from n3.

In a second aspect, the present disclosure provides another organic light-emitting display panel, including: an array substrate, including a flexible substrate and a thin film transistor layer placed on the flexible substrate; an organic light-emitting component placed on the array substrate, the organic light-emitting component including a plurality of light-emitting units; and a packaging layer placed on a side of the organic light-emitting component away from the array substrate, the packaging layer at least including a first inorganic packaging layer, a first scattering layer and a first organic packaging layer, the first inorganic packaging layer, the scattering layer and the first organic packaging layer being placed in order on a side of the packaging layer along a direction away from the array substrate; wherein a refractive index of the first inorganic packaging layer is defined as n1, a refractive index of the first organic packaging layer is defined as n2, a refractive index of the first scattering layer decreases in gradient along a direction from the first inorganic packaging layer to the first organic packaging layer, a greatest refractive index of the first scattering layer is defined as n7, a smallest refractive index of the first scattering layer is defined as n8, wherein n7>n1, and n8<n2.

In a third aspect, the present disclosure provides an organic light-emitting display device, including the organic light-emitting display panel in the first aspect.

In a fourth aspect, the present disclosure provides an organic light-emitting display device, including the organic light-emitting display panel in the second aspect.

The scattering particles are placed in the first organic packaging layer. A refractive index n3 of the scattering particles is different from a refractive index n2 of the first organic packaging layer, for improving an optical effect. Or, the first scattering layer is placed between the first inorganic packaging layer and the first organic packaging layer, a refractive index of the first scattering layer decreases in gradient along a direction from the first inorganic packaging layer to the first organic packaging layer. A greatest refractive index of the first scattering layer is defined as n7, a smallest refractive index of the first scattering layer is defined as n8, n7>n1, and n8<n2.

DESCRIPTION OF EMBODIMENTS

Figure 1:
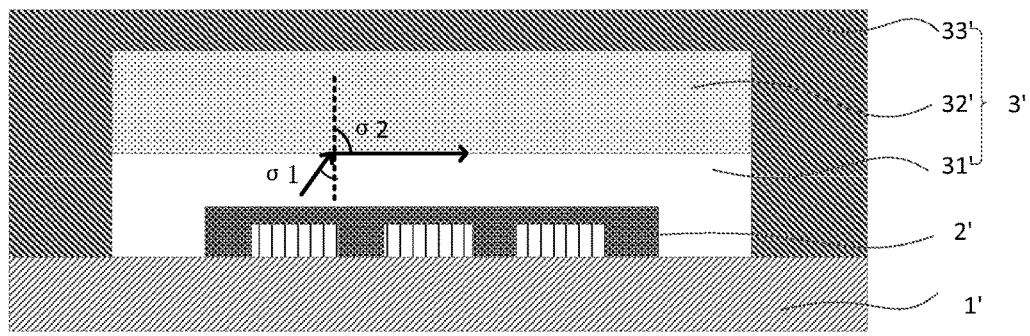
FIG. 1 is a schematic view of an organic light-emitting display panel, as known in the prior art.

For clearly illustrating the purposes, features, and advantages of the present disclosure, the present disclosure will be further described by the following embodiments with reference to the accompanying drawings. However, the embodiments can be implemented in a variety of forms, and the present disclosure shall not be interpreted to be limited to the embodiments herein. The embodiments are provided to make the present disclosure more sufficiently and completely, and conceptions of the embodiments are completely conveyed to those skilled in the art. Identical reference represents same or similar structure in the drawings, thus repetition thereof will be omitted. The words expressing position and direction described in the present disclosure are illustrated by taking accompanying drawings as examples, but can also be made a change as needed, and all changes made should be contained in the scope of the present disclosure. The accompanying drawings of the present disclosure are only used for illustrating relative position relation, and thickness at some positions is exaggerated to facilitate understanding, so that the thickness in accompanying drawings does not represent the actual thickness.

It should be noted that, details in the following description are used to sufficiently understand the present disclosure. However, the present disclosure can be implemented with a variety of ways different from ways described herein, and those skilled in the art can do similar popularization without having prejudice to intension of the present disclosure. Therefore, the present disclosure is not limited by following embodiments. Some terms are used to represent specific components in the specification and claims, but it is understood by those skilled in the art that, a hardware manufacturer may call same components with different names. Instead of differentiating between names as a way of differentiating components, a criterion of differentiating between function differences as a way of differentiating components is used in the specification and claims. Expressions "comprising" and "including" as mentioned in the specification and claims belong to an open language, therefore should be construed to "include but be not limited to". The following description in the specification show preferred embodiments of the present disclosure, however the description is for the purpose of the rule for illustrating the present disclosure, rather than limiting the scope of the present disclosure. The protection scope of the present disclosure is defined depending on the appended claims.

Referring to FIG. 1, which is a schematic view of an OLED display panel, as known in prior related art, the OLED display panel is shown as including an array substrate 1', an organic light-emitting component 2', and a packaging layer 3'. The packaging layer 3' makes the organic light-emitting component 2' be packaged in a sealed space, to prevent moisture and oxygen from entering into the organic light-emitting component 2' and affecting the performance of the organic light-emitting component 2'. The packaging layer generally includes a first inorganic packaging layer 31', an organic packaging layer 32', and a second inorganic packaging layer 33'. The first inorganic packaging layer 31' is usually made of metal oxides or nitrides, such as aluminum oxide, silicon nitride, and so on. The refractive index of aluminum oxide is about 1.765, and the refractive index of silicon nitride is about 2.3. The organic packaging layer 32' is usually made of organic compounds, such as acrylic resin and epoxy resin. The refractive indexes of acrylic resin and epoxy resin are about 1.5. Since the refractive index of the first inorganic packaging layer 31' is greater than the refractive index of the organic packaging layer 32', when light emitted from the organic light-emitting component enters into the organic packaging layer 32' via the first inorganic packaging layer 31' with an incident angle $\alpha 1$, that is, when light passes from an optically denser medium to an optically thinner medium, The angle $\alpha 2$ of the refracted light is greater than the incident angle $\alpha 1$, thus causing the light to be refracted at a larger angle. Thus, light from one light-emitting unit may enter into another light-emitting unit adjacent to the light-emitting unit, which thus causes color mixing and affects display performance. The refractive index of the first inorganic packaging layer 31' is referred to ton1', and the refractive index of the organic packaging layer 32' is referred to n2'. When n1'≥sinσ1/n2', a total reflection may easily happen, that is, σ2=90°, which affects luminous efficiency and then affects the display performance.

Figure 2:
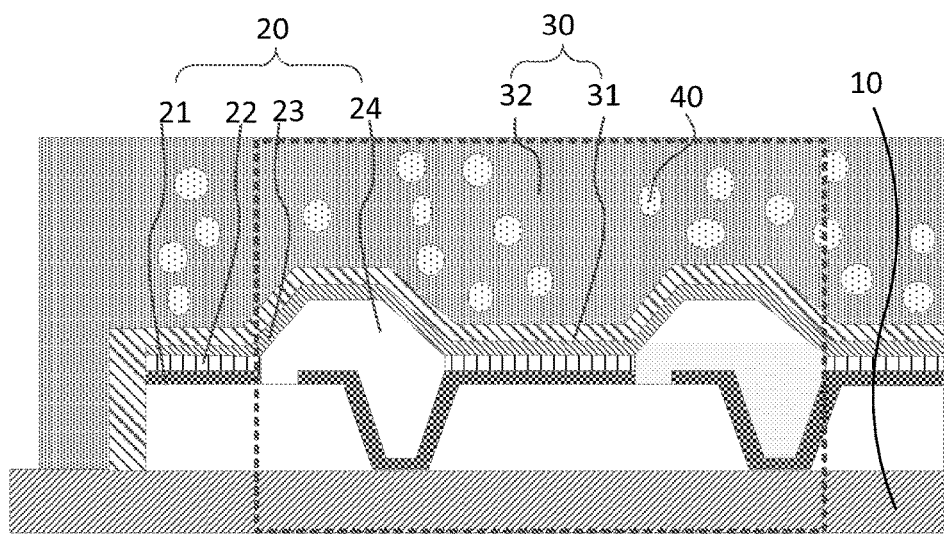
FIG. 2 is a cross sectional view of an organic light-emitting display panel according to an embodiment of the present disclosure.

Referring to FIG. 2, which is a cross sectional view of an organic light-emitting display panel according to an embodiment of the present disclosure, the organic light-emitting display panel is shown as including an array substrate 10, an organic light-emitting component 20 placed on the array substrate 10, and a packaging layer 30 placed on aside of the organic light-emitting component 20 away from the array substrate 10. The organic light-emitting component 20 includes a plurality of light-emitting units. The packaging layer 30 includes a first inorganic packaging layer 31 and a first organic packaging layer 32 placed in order on the packaging layer 30 along a direction away from the array substrate 10. A refractive index of the first inorganic packaging layer 31 is referred to as n1, and a refractive index of the first organic packaging layer 32 is referred to as n2. The organic light-emitting display panel further includes a plurality of scattering particles 40 dispersed in the first organic packaging layer 32. A refractive index of the scattering particles 40 is referred to as n3, which is different from n2. Since the refractive index n2 of the first organic packaging layer 32 is different from the refractive index n3 of the scattering particles 40, the viewing angle is enlarged, and the display performance is improved, whose principle is illustrated as follows referring to FIG. 3.

Figure 3:
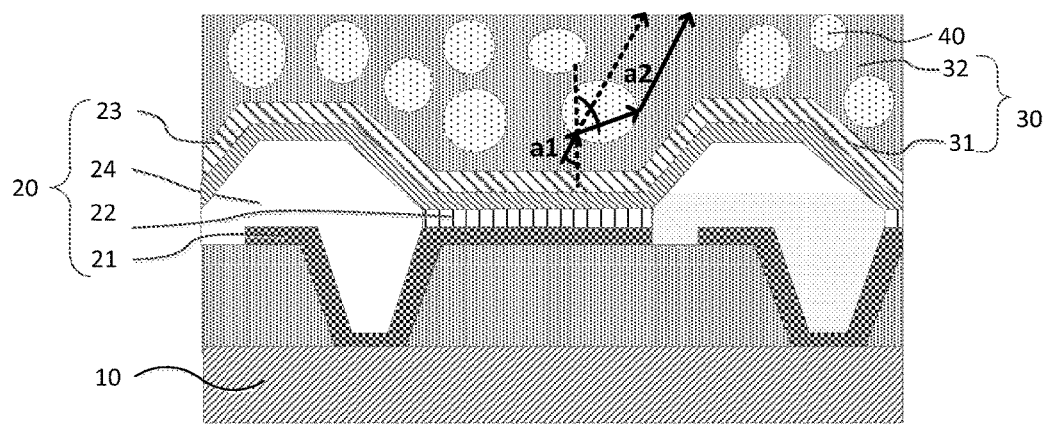
FIG. 3 is an enlarged cross sectional view of a dotted box area in FIG. 2.

In FIG. 3, the refractive index n2 of the first organic packaging layer 32 is greater than the refractive index n3 of the scattering particles 40, at an interface between the first organic packaging layer 32 and the scattering particles 40, light is mainly refracted. The light emitted by the organic light-emitting component 20 enters into the scattering particles 40 via the first organic packaging layer 32, and an incident angle a1 is smaller than a refracted angle a2. Without the scattering particles 40, the light transmission direction won't be changed, and light is transmitted along the direction of the dotted arrow.

As shown in FIG. 3, the scattering particles 40 are placed in the first organic packaging layer 32, and the refractive index n2 of the first organic packaging layer 32 is greater than the refractive index n3 of the scattering particles 40, so that light is scattered by the scattering particles 40, causing the viewing angle to be enlarged.

Figure 4:
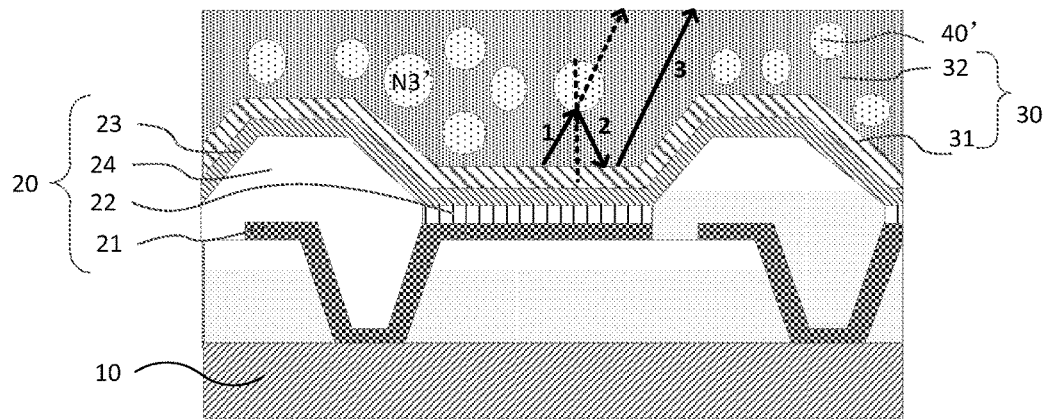
FIG. 4 is another enlarged cross sectional view of the dotted box area in FIG. 2.

In FIG. 4, the refractive index n2' of the first organic packaging layer 32 is smaller than the refractive index n3'of the scattering particles 40', light 1 emitted from the organic light-emitting component 20 is mainly reflected when meeting curved surface of the scattering particles 40', when reflected light 2 meets a cathode 23, light 2 is reflected again to the first organic packaging layer 32 with a new angle to become light 3. Without the scattering particles 40', the transmission direction of light 1 won't be changed, and light 1 is transmitted along the direction of the dotted arrow.

As shown in FIG. 4, the scattering particles 40' are placed in the first organic packaging layer 32, and the refractive index n2 of the first organic packaging layer 32 is smaller than the refractive index n3'of the scattering particles 40', causing the light to be scattered by the scattering particles 40', thereby causing the viewing angle to be enlarged, and the display performance to be improved. The scattering particles 40' are placed in the first organic packaging layer 32, the refractive index of the first organic packaging layer is different from the refractive index of the scattering particles, therefore the viewing angle is effectively enlarged, and the display performance is improved. It should be noted that, for clearly illustrating the light transmission path, a part of the scattering particles is schematically shown in the drawings, and the size and quantity of the scattering particles are also schematic. A situation that light meets only one scattering particle in the first organic packaging layer 32 and is reflected or refracted is only shown as an example. When light meets a plurality of scattering particles in the first organic packaging layer 32, light is also reflected or refracted as described above, which makes light scattered more widely, thereby enlarging the viewing angle and improving the display performance.

Optionally, the scattering particles 40 can be placed in the interior of the first organic packaging layer 32, which means the scattering particles 40 won't contact the first inorganic packaging layer 31, so that the scattering particles 40 are mixed in the first organic packaging layer 32 and are more uniformly dispersed. In addition, in other embodiments, the scattering particles 40 can be placed on an interface between the first inorganic packaging layer 31 and the first organic packaging layer 32, which means that the interface between the first inorganic packaging layer 31 and the first organic packaging layer 32 is roughened, a contact area and an adhering force at the interface of the two layers are increased.

Optionally, a diameter of the scattering particle 40 is in a range of 20 nm-2000 nm. With such a diameter, the scattering particles 40 can be mixed more uniformly in the first organic packaging layer 32, which makes light refraction and light reflection of the scattering particles 40 more uniform, thereby improving the uniformity of the display performance. When the diameter of the scattering particle 40 is smaller than 20 nm, which is smaller than the light wavelength, light may penetrate through the scattering particles 40, so that the scattering particles 40 has little scattering effect on light. When the diameter of the scattering particle 40 is greater than 2000 nm, in one aspect, the scattering particles 40 cannot be mixed uniformly, which affects the uniformity of the display performance; in another aspect, the scattering particles 40 with such a great diameter may affect the thickness of the first organic packaging layer, so that in order to cover the scattering particles 40, the thickness of the first organic packaging layer is required to be increased, which brings disadvantage for thinning. A shape of the scattering particle 40 is not limited in the embodiments of the present disclosure, such as spherical, ellipsoidal quadrilateral, polygonal, and so on.

The array substrate 10 can optionally include a flexible substrate. A material of the flexible substrate can optionally be organic polymers, which is not limited in the present disclosure. For example, the organic polymer can be one of polyimide (PI), polyamide (PA), Polycarbonate (PC), polyether sulphone (PES), polyethylene terephthalate (PET), Polyethylene naphthalate (PEN), polymethyl methacrylate (PMMA), and cycloolefin copolymer (COC).

Although not shown for clarity, the array substrate 10 further includes a thin film transistor layer, a plurality of data lines, and a plurality of scan lines, which are used for realizing display function. The thin film transistor layer at least includes an active layer, a source electrode, a drain electrode, a gate electrode, and an insulation layer. The drain electrode of the thin film transistor is electrically connected with the anode 21 of the organic light-emitting component 20. The data lines and the scan lines intersect with each other. The data line is electrically connected with the source electrode of the thin film transistor layer, and the scan line is electrically connected with the gate electrode of the thin film transistor layer. When working, the scan line controls turn-on and turn-off of each sub-pixel by the gate electrode of the thin film transistor layer, and the data line is electrically connected with the anode 21 of the organic light-emitting component 20 by the source electrode of the thin film transistor layer. When the thin film transistor corresponding to each sub-pixel is turned on, the data line provides a data signal to each sub-pixel, and controls display of each sub-pixel. A detail structure of the thin film transistor layer can use a known technology, which is note repeated herein.

The organic light-emitting component 20 in the embodiment of the present disclosure is placed in a display area of the array substrate 10, and includes an anode 21, a light-emitting unit 22, and a cathode 23. The anode 21, the light-emitting unit 22, and the cathode 23 are placed in order on a side of the array substrate 10 facing the packaging layer 30. The organic light-emitting component 20 can further include one or more layers of a hole injection layer, a hole transmission layer, an electron blocking layer, a hole blocking layer, an electron transmission layer, and an electron injection layer. The organic light-emitting component 20 further includes a pixel defining layer 24. Two adjacent light-emitting units 22 are spaced from each other by the pixel defining layer 24 to form a plurality of light-emitting units. The light-emitting units can include a red light-emitting unit, a green light-emitting unit, or a blue light-emitting unit. The hole injection layer and/or the hole transmission layer can be placed between the anode 21 and the light-emitting unit 22. The electron injection layer and/or the electron transmission layer can be placed between the cathode 23 and the light-emitting unit 22. The hole injection layer, the hole transmission layer, the electron transmission layer, and the electron injection are formed on the whole display area of the array substrate 10. A structure and material of the organic light-emitting component 20 can use a technology in the related art, which is not repeated herein.

Figure 5:
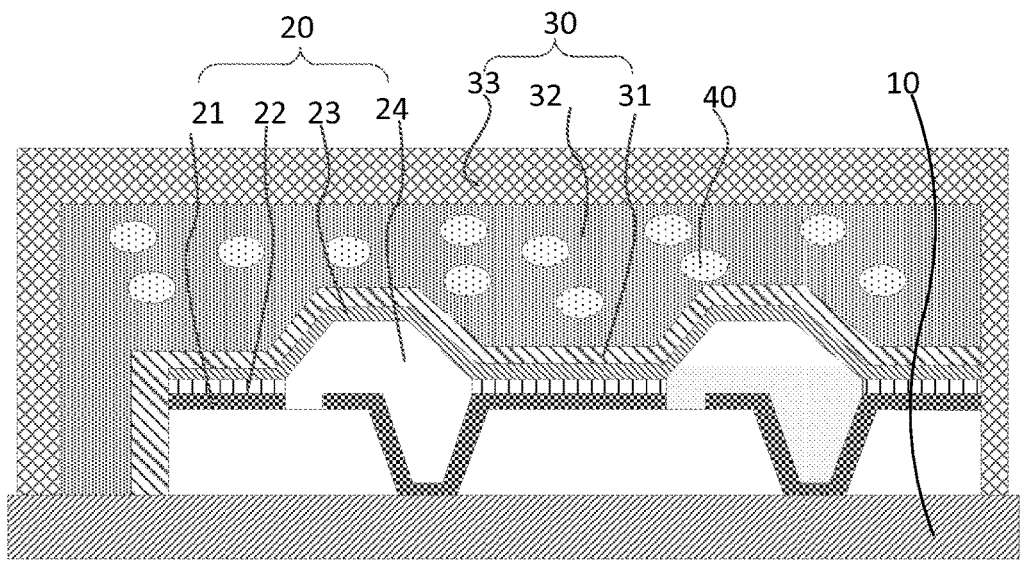
FIG. 5 is a cross sectional view of another organic light-emitting display panel according to an embodiment of the present disclosure.

FIG. 5 shows the cross sectional view of an organic light-emitting display panel, in accordance with another embodiment of the present invention. Different from the organic light-emitting display panel as shown in FIG. 2, the organic light-emitting display panel as shown in FIG. 5 further includes a second inorganic packaging layer 33 placed on aside of the first organic packaging layer 32 away from the array substrate 10. The second inorganic packaging layer 33 can further improve the packaging effect and prolong a usage lifetime of the organic light-emitting display panel. Optionally, a material of the second inorganic packaging layer 33 can include one or any combination of silicon nitride, silicon oxide, silicon oxycarbide, silicon oxynitride, aluminum oxide, and titanium oxide.

Figure 6:
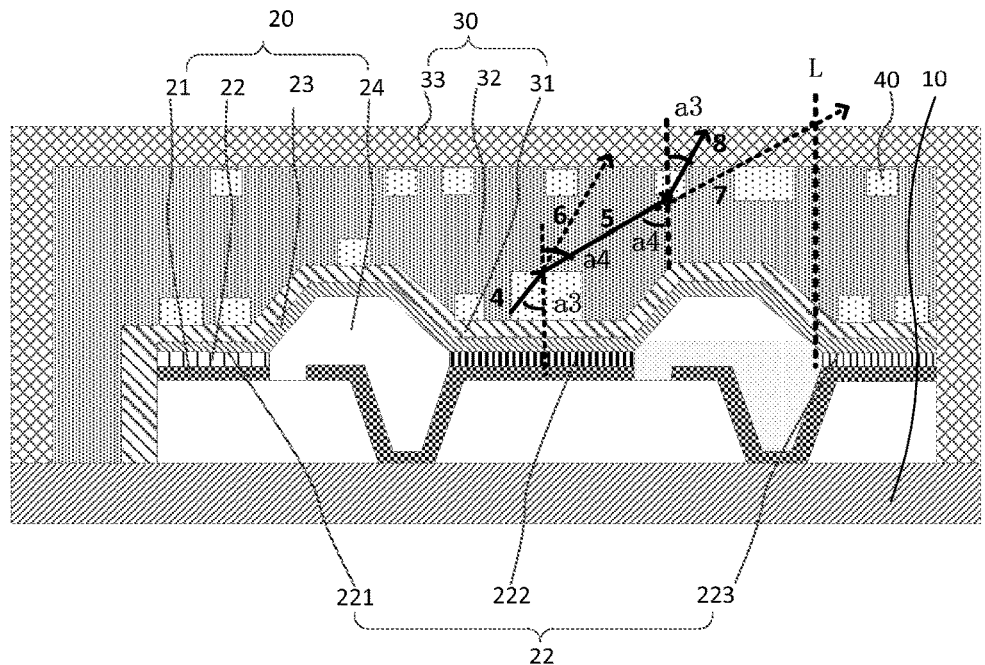
FIG. 6 is a cross sectional view of another organic light-emitting display panel according to an embodiment of the present disclosure.

FIG. 6, shows the cross sectional view of an organic light-emitting display panel, according to another embodiment of the present disclosure. The scattering particles 40 can be placed on an interface of the first inorganic packaging layer 31 and the first organic packaging layer 32 and an interface of the first organic packaging layer 32 and the second inorganic packaging layer 33. An arrangement of the scattering particles 40 is not limited in the embodiment of the present disclosure. The scattering particles 40 can be arranged in an array or arranged disorderly, as long as the scattering particles 40 can be placed on an interface of the first inorganic packaging layer 31 and the first organic packaging layer 32 and/or an interface of the first organic packaging layer 32 and the second inorganic packaging layer 33, the arrangement is within the scope of the present disclosure. When the refractive index of the scattering particles 40 is greater than the refractive index of the first organic packaging layer, light is mainly reflected. Since the scattering particles 40 can be placed on an interface of the first inorganic packaging layer 31 and the first organic packaging layer 32 and/or an interface of the first organic packaging layer 32 and the second inorganic packaging layer 33, compared with the structure without the scattering particles 40, an area of the interface reflecting light is increased, so that light reflection is effectively increased, and light can be scattered in each direction, thereby enlarging the viewing angle and improving the display effect. It is illustrated as follows that when the refractive index of the scattering particles 40 is smaller than the refractive index of the first organic packaging layer, the viewing angle is enlarged and the display effect is improved.

An incident light 4 emitted by the light-emitting unit 222 enters into the first organic packaging layer 32 via the scattering particles 40 with an incident angle a3, and is refracted at the interface to form a refractive light 5. The refractive light 5 enters into the first organic packaging layer 32 with a refraction angle a4. Since the refractive index n3 of the scattering particles 40 is smaller than the refractive index n2 of the first inorganic packaging layer, a4>a3. When without the scattering particles, the incident light 4 may be transmitted along a direction of a dotted arrow 6. The refracted light 5 has a greater viewing angle, compared with the direction of a dotted arrow 6. When the refracted light 5 enters into the scattering particles 40 via the first organic packaging layer 32 again, the refracted light 5 is refracted once again to form a refracted light 8. Since the refractive index n3 of the scattering particles 40 is smaller than the refractive index n2 of the first organic packaging layer, a4>a3. If no scattering particle is placed on the interface between the first organic packaging layer 32 and the second inorganic packaging layer, the refracted light 5 may be transmitted along a direction of a dotted arrow 7, so that light emitted by the light-emitting unit 222 enters into an adjacent light-emitting unit 223. A light-emitting unit on left of a dotted line L and adjacent to the dotted line L is the light-emitting unit 222, and a light-emitting unit on right of a dotted line L and adjacent to the dotted line L is the light-emitting unit 223. If no scattering particle is placed on the interface between the first organic packaging layer 32 and the second inorganic packaging layer, the refracted light 5 may be transmitted along the direction of the dotted arrow 7, so that light enters into the light-emitting unit 223, then color mixing may happen. The refractive light 8 has a greater viewing angle, compared with the direction of the dotted arrow 6. Therefore, when the scattering particles 40 are placed on an interface of the first inorganic packaging layer 31 and the first organic packaging layer 32 and an interface of the first organic packaging layer 32 and the second inorganic packaging layer 33, the viewing angle can be effectively increased, and the color mixing can be effectively prevented. It should be noted that, the scattering particles 40 are placed in the first organic packaging layer, a density of the scattering particles 40 is not limited, a part of the scattering particles 40 are schematically shown in FIG. 6, the size of the scattering particles 40 are schematically shown in FIG. 6, and thus the quantity and size of the scattering particles 40 are not limited in the embodiment of the present disclosure, which can be determined according to actual requirements by those skilled in the art. It is further noted that, light may pass through a plurality of scattering particles 40, however light passes through only two scattering particles 40 schematically shown in FIG. 6. A principle that light passes through a plurality of scattering particles 40 is also similar as above described, which is not repeated herein.

Figure 7:
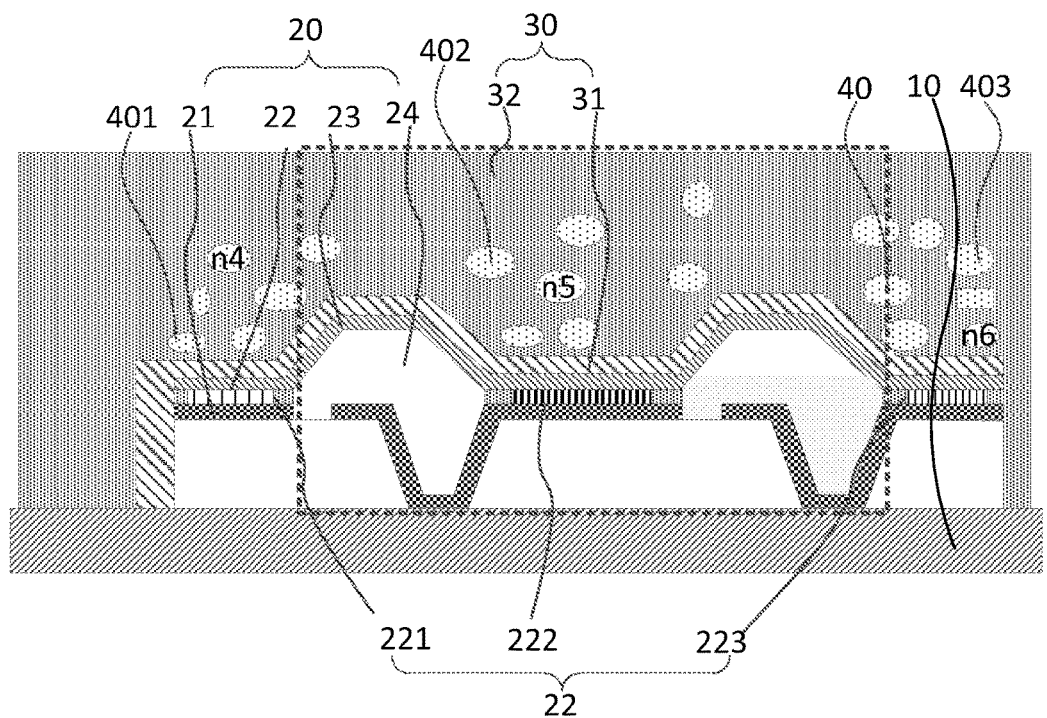
FIG. 7 is a cross sectional view of another organic light-emitting display panel according to an embodiment of the present disclosure.

FIG. 7 shows the cross sectional view of an organic light-emitting display panel, in accordance with another embodiment of the present invention Different from the above-described embodiments, the scattering particles 40 are placed in an area corresponding to the light-emitting unit 22, and a projection of the light-emitting unit 22 on the array substrate 10 is in an area where a projection of the scattering particles 40 on the array substrate 10 is located. The refractive index n3 of the scattering particles 40 is greater than the refractive index n2 of the first organic packaging layer 32, light is mainly reflected. Since the scattering particles 40 are placed in an area corresponding to the light-emitting unit 22, and the projection of the light-emitting unit 22 on the array substrate 10 is in the area where the projection of the scattering particles 40 on the array substrate 10 is located, a reflection area can be increased. Compared with a situation that the scattering particles are placed in an area corresponding to the light-emitting unit, and the projection of the light-emitting unit 22 on the array substrate overlaps the projection of the scattering particles on the array substrate, the scattering area is increased, so that light can enter an area with a greater viewing angle, so that the viewing angle is enlarged. It is illustrated as follows that when the refractive index n3 of the scattering particles 40 is smaller than the refractive index n2 of the first organic packaging layer 32, the viewing angle is enlarged and the display effect is improved. Please refer to FIG. 8, which is an enlarged cross sectional view of a dotted box area in FIG. 7, m is an area where the light-emitting unit 22 is located, and n is an area where the scattering particles 40 are located. From FIG. 8, it can be seen that, the projection of the light-emitting unit on the array substrate is in the area where the projection of the scattering particles 40 on the array substrate 10 is located. Light 01 enters into the scattering particles 40 from the first organic packaging layer 32 with an incident angle a5, then is refracted at the interface with a refraction angle a6, and the refracted light 11 is transmitted in the scattering particles 40, then enters into the first organic packaging layer 32 with a refraction angle a5 to form a refraction light 13. Since the refractive index n2 of the first organic packaging layer 32 is greater than the refractive index n3 of the scattering particles 40, thus a6>a5. If there is no scattering particle, that is, if the projection of the scattering particles on the array substrate does not exceed the projection of the light-emitting unit on the array substrate, light 01 will be transmitted along a direction of the dotted arrow 12, thus the scattering particles 40 provide certain divergent effect on the light, so as to enlarge the viewing angle. Therefore, the scattering particles are placed in an area corresponding to the light-emitting unit, and a projection of the light-emitting unit 22 on the array substrate is in an area where a projection of the scattering particles on the array substrate is located, thus the viewing angle is improved effectively.

The light-emitting unit 22 can include a red light-emitting unit 221, a green light-emitting unit 222, and a blue light-emitting unit 223. The scattering particles 40 include a plurality of first scattering particles, a plurality of second scattering particles, and a plurality of third scattering particles. The first scattering particles correspond to the red light-emitting unit 221, and a refractive index of the first scattering particles is referred to as n4. The second scattering particles correspond to the green light-emitting unit 222, and a refractive index of the second scattering particles is referred to as n5. The third scattering particles correspond to the blue light-emitting unit 223, and a refractive index of the third scattering particles is referred to as n6. The refractive index of the first organic packaging layer 32 is referred to as n2, and $n4 \geq n5 > n6 > n2$, or $n4 \leq n5 < n6 < n2$.

Figure 9:
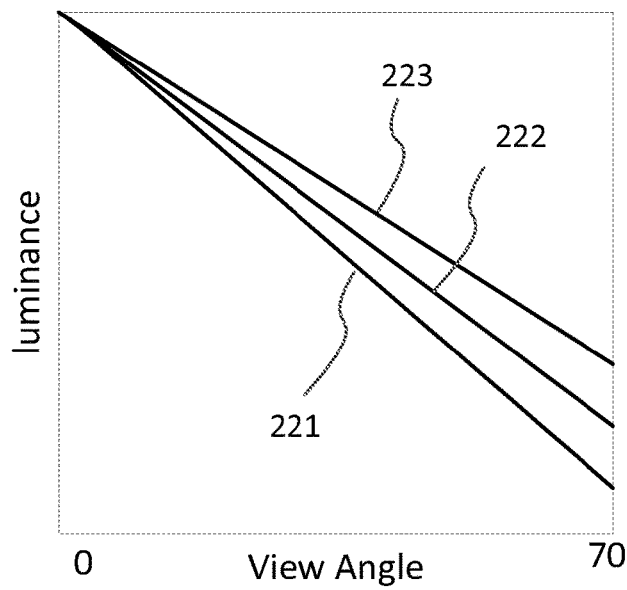
FIG. 9 is an optical simulation plot of luminance versus view angle of an organic light-emitting display panel in the related art at different viewing angles.

FIG. 9 shows a simulated luminance of an organic light-emitting display panel at different viewing angles; the horizontal axis shows the viewing angle, the vertical axis shows the brightness or luminance. Using simulation, the inventor has found that, with the increase of the viewing angle, the brightness of the red light-emitting unit 221, the brightness of the green light-emitting unit 222, and the brightness of the blue light-emitting unit 223 decreases, especially, the brightness of the red light-emitting unit 221 decreases the most. Thus, the organic light-emitting display panel of the prior art may tend to show a blue color at a large viewing angle, and especially, when bending the display panel, a bending area tends to be blue. Therefore, more red light is required to be supplemented to keep a white balance at the large viewing angle.

In the embodiment of the present disclosure, the first scattering particles 401 with a refractive index n4 are arranged in the area corresponding to the red light-emitting unit 221, the second scattering particles 402 with a refractive index n5 are arranged in the area corresponding to the green light-emitting unit 222, and the third scattering particles 403 with a refractive index n6 are arranged in the area corresponding to the blue light-emitting unit 223, $n4 \geq n5 > n6 > n2$, or $n4 \leq n5 < n6 < n2$, that is, a refractive index difference between the red light-emitting unit 221 and the first organic packaging layer 32 is greater than or equal to a refractive index difference between the green light-emitting unit 222 and the first organic packaging layer 32, and a refractive index difference between the green light-emitting unit 222 and the first organic packaging layer 32 is greater than a refractive index difference between the blue light-emitting unit 223 and the first organic packaging layer 32, so that brightness of red light and brightness of green light can be effectively improved at the large viewing angle, so as to keep the white balance at the large viewing angle, and the problem that the panel tends to show a blue color at the large viewing angle is alleviated. When the refractive indexes of the first, second and third scattering particles 40 are greater than that of the first organic packaging layer 32, $n4 \geq n5 > n6 > n2$, light is mainly reflected, the greater the refractive indexes, the more widely light is scattered, and thus more light enters into the large viewing angle area. Therefore, the refractive index of the first scattering particles 401 is greatest, and more light emitted by the red light-emitting unit enters into the large viewing angle area, so that the brightness of red light is increased, thereby alleviating the problem that the panel tends to show a blue color at the large viewing angle.

Figure 8:
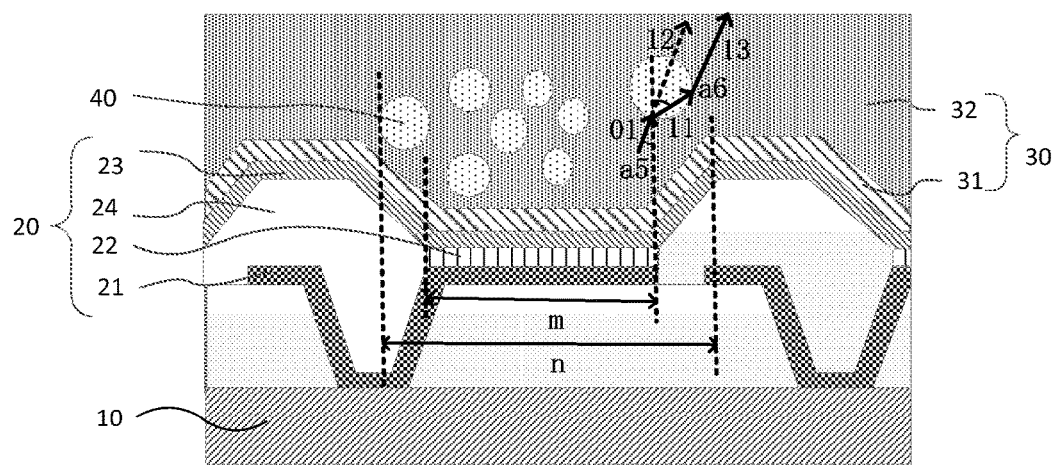
FIG. 8 is an enlarged cross sectional view of a dotted box area in FIG. 7.

When the refractive index n3 of the scattering particles 40 is smaller than the refractive index n2 of the first organic packaging layer 32, as shown in FIG. 8, the scattering particles 40 play a scattering function to the light, the smaller the refractive index of the scattering particles, the more widely light is scattered, and the greater the viewing angle, so that $n4 \leq n5 < n6 < n2$, the first scattering particles corresponding to the red light-emitting unit 221 has a smallest refractive index, and more red light enters into the large viewing angle. Thus, the brightness of red light in the large viewing angle area is increased, thereby alleviating the problem that the panel tends to show a blue color at the large viewing angle. It should be noted that, setting a distribution density of the first scattering particles to be greater than or equal to that of the second scattering particles, and setting a distribution density of the second scattering particles to be greater than that of the third scattering particles, are also possible, so that the brightness of red light and the brightness of green light is improved, thereby alleviating the problem that the panel tends to show a blue color at the large viewing angle.

Figure 10:
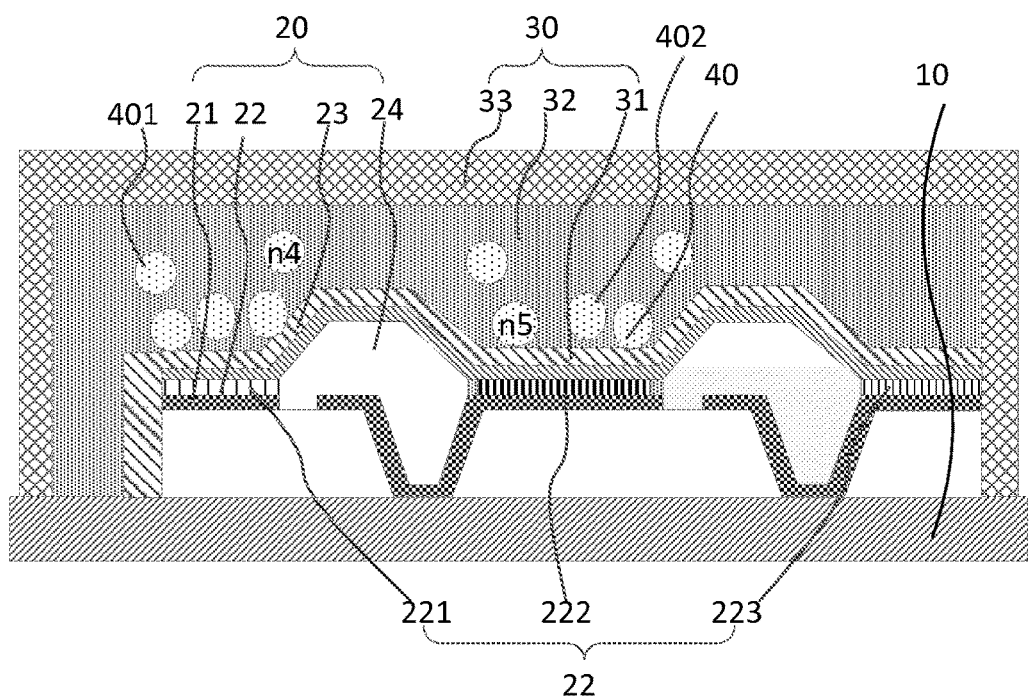
FIG. 10 is a cross sectional view of another organic light-emitting display panel according to an embodiment of the present disclosure.

FIG. 10 shows the cross sectional view of an organic light-emitting display panel, in accordance with another embodiment of the present invention. In the embodiment shown in FIG. 10, in contrast to that shown in FIG. 7, the scattering particles 40 are placed in an area corresponding to the red light-emitting unit 221 and the green light-emitting unit 222, and a projection of the red light-emitting unit 221 on the array substrate 10 and a projection of the green light-emitting unit 222 on the array substrate 10 are located in an area where a projection of the scattering particles 40 on the array substrate 10 is located.

The scattering particles 40 include a plurality of first scattering particles and a plurality of second scattering particles. The first scattering particles correspond to the red light-emitting unit 221, and a refractive index of the first scattering particles is referred to as n4. The second scattering particles correspond to the green light-emitting unit 222, and a refractive index of the second scattering particles is referred to as n5. The refractive index of the first inorganic packaging layer 31 is referred to as n1, and n4≥n5>n2, or n4≤n5<n2. In the present embodiment, n4≥n5>n2, or n4≤n5<n2, so that more red light and green light can enter into a large viewing angle, the brightness of red light and the brightness of green light can be improved to keep the white balance in the large viewing angle, thereby alleviating the problem that the panel tends to show a blue color at the large viewing angle. The principle is similar to that as described above, which is not repeated herein.

Optionally, the scattering particles 40 can be placed in the interior of the first organic packaging layer 32, which means the scattering particles 40 won't contact other layers, so that the scattering particles 40 are mixed in the first organic packaging layer 32 and are more uniformly dispersed, and the display effect is more uniform. In addition, in other embodiments, the scattering particles 40 can be placed on an interface between the first inorganic packaging layer 31 and the first organic packaging layer 32, and the scattering particles 40 can be further placed on an interface between the first organic packaging layer 32 and the second inorganic packaging layer 33, which means that the interface between the first inorganic packaging layer 31 and the first organic packaging layer 32 or the interface between the first organic packaging layer 32 and the second inorganic packaging layer 33 is roughened, a contact area and an adhering force at the interface of the two layers are increased.

Optionally, the material of the scattering particles 40 in any one of the embodiments described as above may include one or any combination of silicon nitride, silicon oxide, and silicon oxynitride; and materials of the first inorganic packaging layer 31 and the second inorganic packaging layer 33 can include one or any combination of metal oxides, non-metal oxides, nitrides, oxynitrides, oxycarbides. For example, the materials of the first inorganic packaging layer 31 and the second inorganic packaging layer 33 may include one or any combination of aluminum oxide, titanium oxide, silicon nitride, silicon oxide, silicon oxynitride, and silicon oxycarbide. When making silicon oxynitride, a content of nitrous oxide (source of oxygen) and a content of ammonia (source of nitrogen) are adjusted, thereby obtaining silicon oxynitride with different nitrogen contents and different oxygen contents. The refracted indexes of silicon oxynitride with different nitrogen contents and different oxygen contents are tested and listed in Table 1 below.

It's known from Table 1 that, the refractive index of silicon oxynitride can be adjusted by adjusting the oxygen content, and the higher the oxygen content, the lower the refractive index. Therefore, the oxygen content of silicon oxynitride used in the first scattering particles is smaller than or equal to the oxygen content of silicon oxynitride used in the second scattering particles, and the oxygen content of silicon oxynitride used in the second scattering particles is smaller than the oxygen content of silicon oxynitride used in the third scattering particles, so that n4≥n5>n6>n2, more red light-emitting units enter into the large viewing angle area, and the brightness of red light at the large viewing angle is increased, thereby alleviating the problem that the panel tends to show a blue color at the large viewing angle. Or, the oxygen content of silicon oxynitride used in the first scattering particles is greater than or equal to the oxygen content of silicon oxynitride used in the second scattering particles, and the oxygen content of silicon oxynitride used in the second scattering particles is greater than the oxygen content of silicon oxynitride used in the third scattering particles, so that n4≤n5<n6<n2, more red light-emitting units enter into the large viewing angle, and the brightness of red light in the large viewing angle is increased, thereby alleviating the problem that the panel tends to show a blue color at the large viewing angle. The principle is similar to that as described above, which is not repeated herein.

Table 1 Lists the Refractive Index of Silicon Oxynitride with Different Nitrides Table I

| Composition silicon nitride | Refractive Index |
| --- | --- |
| SiO | 1.47 |
| SiON | 1.55 |
| SiON2 | 1.8 |
| SiN | 2.3 |

Figure 11:
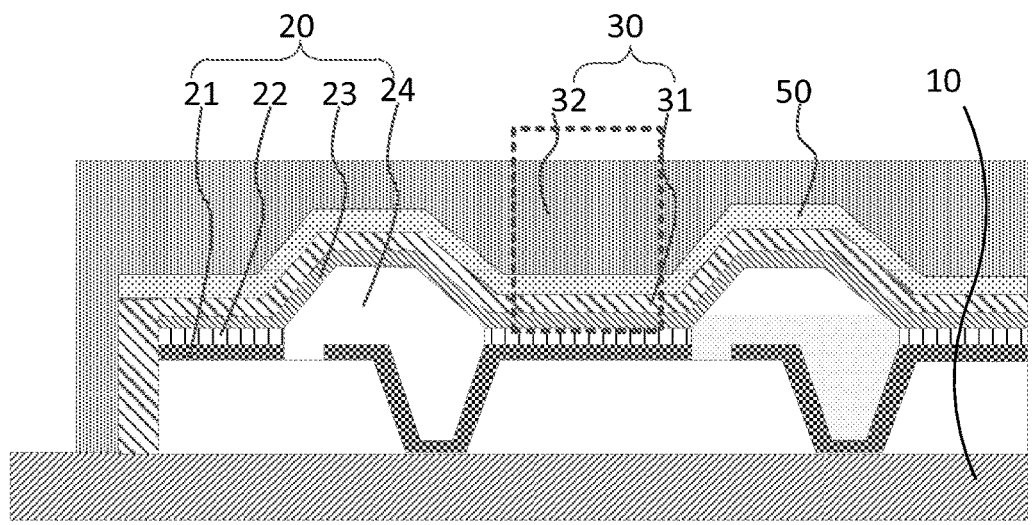
FIG. 11 is a cross sectional view of another organic light-emitting display panel according to an embodiment of the present disclosure.

FIG. 11 shows the cross sectional view of an organic light-emitting display panel, in accordance with another embodiment of the present invention. The organic light-emitting display panel is shown as including an array substrate 10, an organic light-emitting component 20 placed on the array substrate 10, and a packaging layer 30 placed on aside of the organic light-emitting component 20 away from the array substrate 10. The array substrate 10 includes a flexible substrate and a thin film transistor (not shown) on the flexible substrate. The organic light-emitting component 20 includes a plurality of light-emitting units 22. The packaging layer 30 includes a first inorganic packaging layer 31, a first scattering layer 50, and a first organic packaging layer 32, which are placed in order on a side of the packaging layer 30 along a direction away from the array substrate 10. The refractive index of the first inorganic packaging layer 31 is referred to as n1, and the refractive index of the first organic packaging layer 32 is referred to as n2. Along a direction from the first inorganic packaging layer 31 to the first organic packaging layer 32, the refractive index of the first scattering layer 50 decreases in gradient, a greatest refractive index of the first scattering layer 50 is referred to as n7, a smallest refractive index of the first scattering layer 50 is referred to as n8, n7>n1, and n8<n2.

Figure 12:
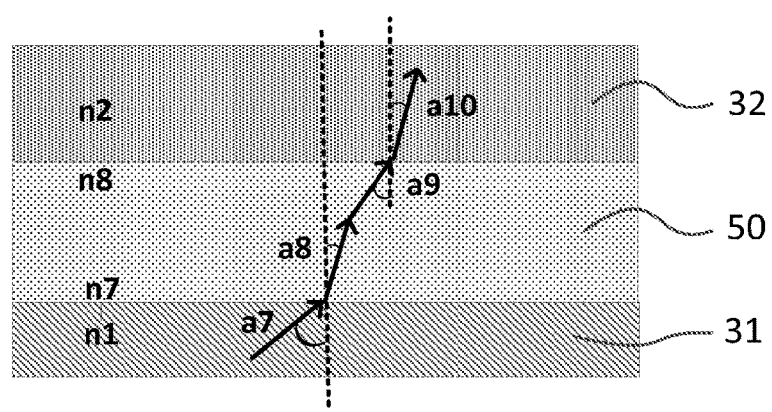
FIG. 12 is an enlarged cross sectional view of a dotted box area in FIG. 11.

With such a structure, referring to FIG. 12, the light emitted by the organic light-emitting component 20 passes through the first inorganic packaging layer 31, and enters into the first scattering layer 50 with an incident angle a7, then is refracted at the interface with a refraction angle a8. Since n7>n1, light enters into the first scattering layer 50 from the first inorganic packaging layer 31 is from an optical denser medium to an optical thinner medium, according to the refraction formula:

$$\frac{n1}{n7} = \frac{\sin\ a8}{\sin\ a7},$$

since n7>n1, so that a7>a8, and a total reflection won't happen, which can effectively prevent a total reflection when light emitted by the organic light-emitting component directly enters into the first organic packaging layer 32 with a lower refractive index from the first inorganic packaging layer 31 with a high refractive index. Similarly, when light is transmitted in the first scattering layer 50, since the refractive index of the first scattering layer 50 decreases in gradient along the direction from the first inorganic packaging layer 31 to the first organic packaging layer 32, it is assumed that, when the decrease gradient of the refractive index of the first scattering layer 50 along the direction from the first inorganic packaging layer 31 to the first organic packaging layer 32 is Δn, a total reflection happens, according to a formula:

$$\frac{n7}{n7 + \Delta n} = \frac{\sin 90°}{\sin\ a8},$$

then Δn=n7(1−sin a8). Therefore, as long as the refractive index of the first scattering layer 50 decreases in gradient along the direction from the first inorganic packaging layer 31 to the first organic packaging layer 32 with the decrease gradient smaller than n7(1−sin a8), the total reflection at the first scattering layer 50 can be prevented, thereby improving the luminous efficiency. Similarly, when light enters into the first organic packaging layer 32 with an incident angle a9 from the first scattering layer 50, then is refracted at the interface with a refraction angle a10, according to a formula:

$$\frac{n2}{n8} = \frac{\sin\ a9}{\sin\ a10},$$

and n8<n2, then a9>a10, so that the total reflection at the first scattering layer 50 can be prevented, thereby improving the luminous efficiency.

Optionally, the first scattering layer 50 of the embodiment of the present disclosure can include silicon oxynitride. The oxygen content of silicon oxynitride increases in gradient along the direction from the first inorganic packaging layer 31 to the first organic packaging layer 32. As described above, when making silicon oxynitride, by adjusting a content of $N_2O$ (source of oxygen in silicon oxynitride) and a content of $NH_3$ (source of nitrogen in silicon oxynitride), silicon oxynitrides with different nitrogen and oxygen contents are obtained. After testing the refractive indexes of silicon oxynitrides with different nitrogen and oxygen contents, it is found that, the refractive index of silicon oxynitride decreases with an increase of the oxygen content. Therefore, in the embodiment of the present disclosure, the oxygen content of silicon oxynitride increases in gradient along the direction from the first inorganic packaging layer 31 to the first organic packaging layer 32, so that the total reflection is prevented when light enters into the first organic packaging layer 32 from the first inorganic packaging layer 31, thereby improving the luminous efficiency.

Optionally, the first inorganic packaging layer can be made of one or any combination of metal oxides, non-metal oxides, nitrides, oxynitrides, oxycarbides. For example, the first inorganic packaging layer 31 can be made of one or any combination of aluminum oxide, titanium oxide, silicon nitride, silicon oxide, silicon oxynitride, and silicon oxycarbide. When the first inorganic packaging layer 31 is made of silicon nitride, since the oxygen content of the first scattering layer adjacent to the first inorganic packaging layer 31 is relatively low, while the nitrogen content is relatively high, a property of silicon oxynitride is close to that of silicon nitride, so that a contact performance between the first scattering layer and the first inorganic packaging layer 31 becomes better. In addition, silicon nitride has a better anti-water-oxygen effect, so that a usage lifetime of the organic light-emitting display panel is longer. The first inorganic packaging layer 31 can also be made of aluminum oxide. A contact performance between the first scattering layer and the first inorganic packaging layer 31 is relatively good, and aluminum oxide has a compact film structure, and has a good particle-covering property in a making process by an atomic layer deposition method, so that the organic light-emitting display panel has a better contact performance between layers and has a better packaging effect.

Figure 13:
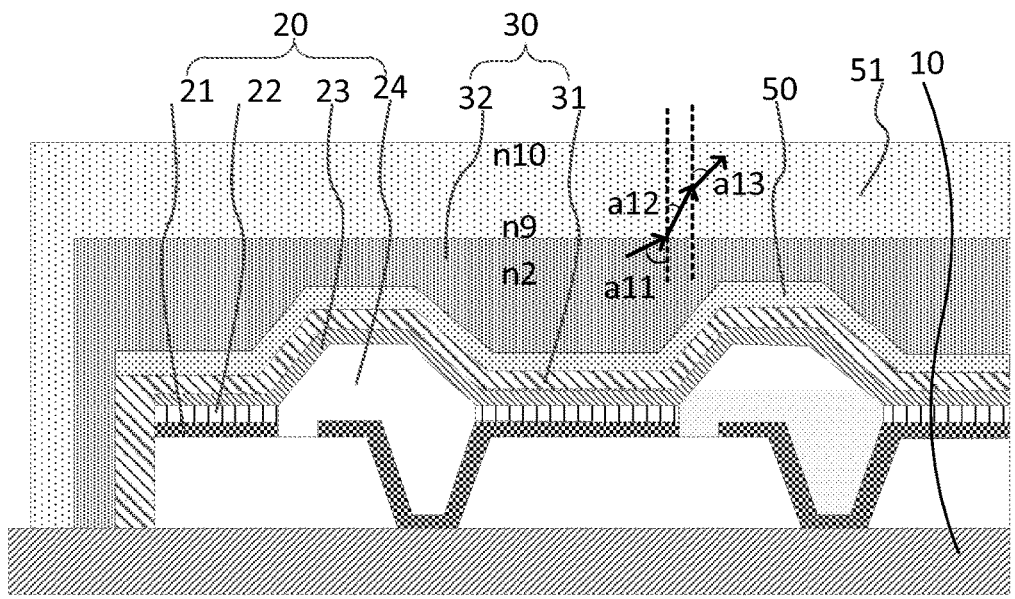
FIG. 13 is a cross sectional view of another organic light-emitting display panel according to an embodiment of the present disclosure.

FIG. 13 shows the cross sectional view of an organic light-emitting display panel, in accordance with another embodiment of the present invention. The organic light-emitting display panel of FIG. 13 is shown as including a second scattering layer 51 placed on aside of the first organic packaging layer 32 away from the first inorganic packaging layer 31. The refractive index of the second scattering layer 51 decreases in gradient along a direction from the first inorganic packaging layer 31 to the first organic packaging layer 32, a greatest refractive index of the second scattering layer 51 refers to n9, a smallest refractive index of the second scattering layer 51 is referred to as n10, n9>n2, and n2 refers to the refractive index of the first organic packaging layer. With such a structure, when light enters into the second scattering layer 51 with an incident angle a11 from the first organic packaging layer 32, the light is refracted at the interface with a refraction angle a12, a11>a12, and a total reflection can be effectively prevented, thereby improving the luminous efficiency. In addition, when light is transmitted in the second scattering layer 51, since the refractive index of the second scattering layer 51 decreases in gradient along the direction from the first inorganic packaging layer 31 to the first organic packaging layer 32, an emergence angle a13 is greater than an incident angle a12, light is scattered more widely, and the viewing angel is effectively enlarged.

Figure 14:
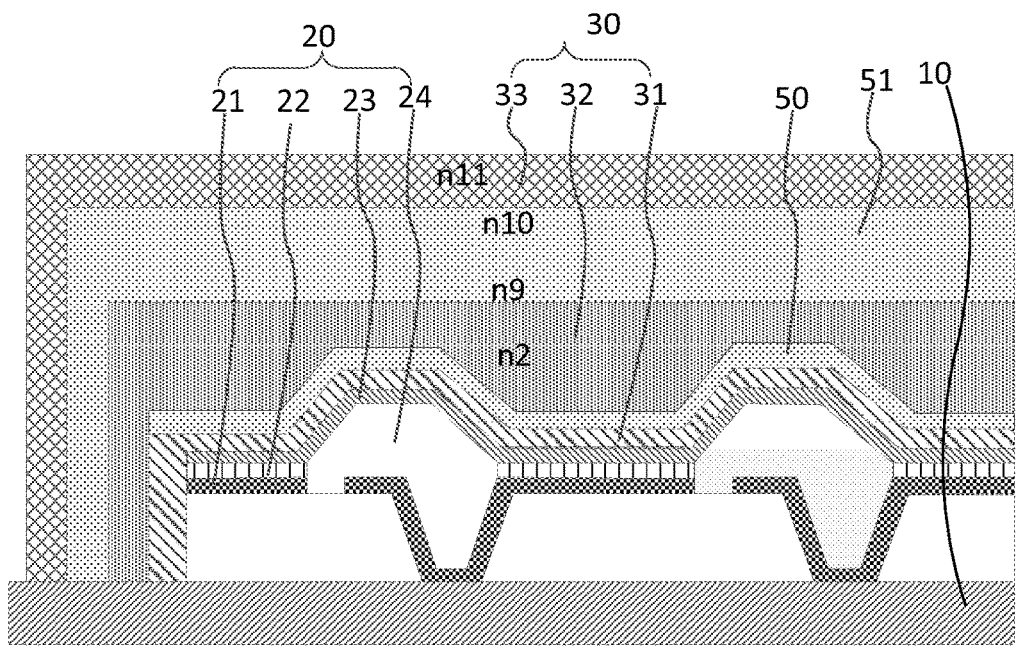
FIG. 14 is a cross sectional view of another organic light-emitting display panel according to an embodiment of the present disclosure.

FIG. 14 shows the cross sectional view of an organic light-emitting display panel, in accordance with another embodiment of the present invention. The organic light-emitting display panel shown in FIG. 14 is shown as including a second inorganic packaging layer 33 on a side of the second scattering layer 51 away from the first organic packaging layer 32. The refractive index of the second inorganic packaging layer 33 is referred to as n11, and n10<n11. With such a structure of the second inorganic packaging layer 33, the packaging effect is further improved, and a usage lifetime of the organic light-emitting display panel is prolonged. Since n10<n11, so that a total reflection when light enters into the second inorganic packaging layer from the second scattering layer is prevented to improve the luminous efficiency.

Figure 15:
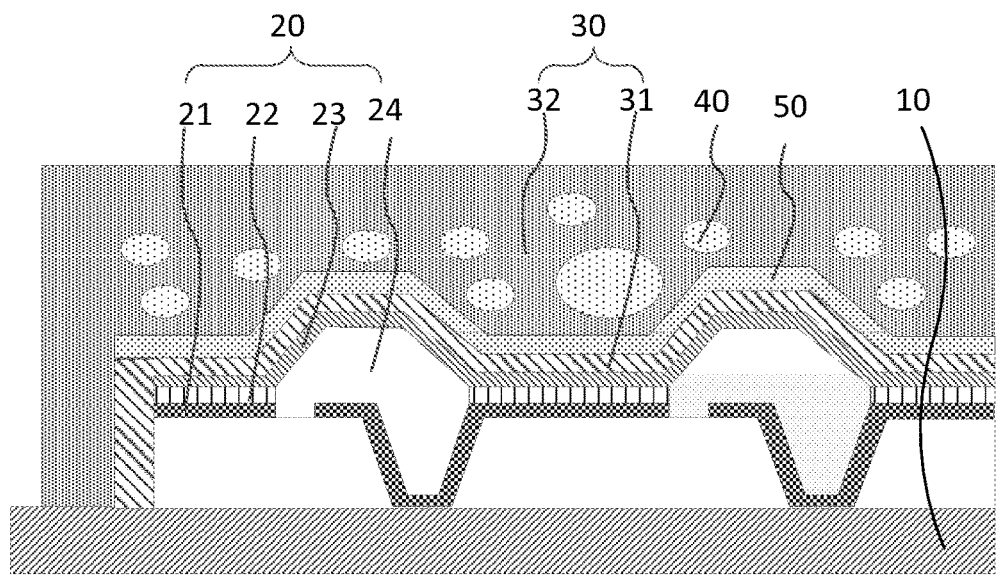
FIG. 15 is a cross sectional view of another organic light-emitting display panel according to an embodiment of the present disclosure.

FIG. 15 shows the cross sectional view of an organic light-emitting display panel, in accordance with another embodiment of the present invention. The organic light-emitting display panel of FIG. 15 is shown, as including h a plurality of scattering particles 40 placed in the first organic packaging layer 32. The refractive index n3 of the scattering particles 40 is different from a refractive index of the first organic packaging layer 32, so that the viewing angle can be effectively enlarged. More detailed description of the organic light-emitting display panel of FIG. 15 is provided with reference to FIGS. 3 and 4, and thus is not repeated. Therefore, in the present embodiment, a first scattering layer 50 is placed between the first inorganic packaging layer 31 and the first organic packaging layer 32, so that a total reflection when light enters into the first organic packaging layer from the first inorganic packaging layer is prevented to improve the luminous efficiency. The scattering particles 40 are placed in the first organic packaging layer 32, so that the viewing angle is enlarged to improve the display effect. It should be noted that, the scattering particles 40 can be placed in the interior of the first organic packaging layer 32, which means the scattering particles 40 won't contact the first inorganic packaging layer 31, or can be placed at an interface between the first inorganic packaging layer 31 and the first organic packaging layer 32, which are not limited herein.

Figure 16:
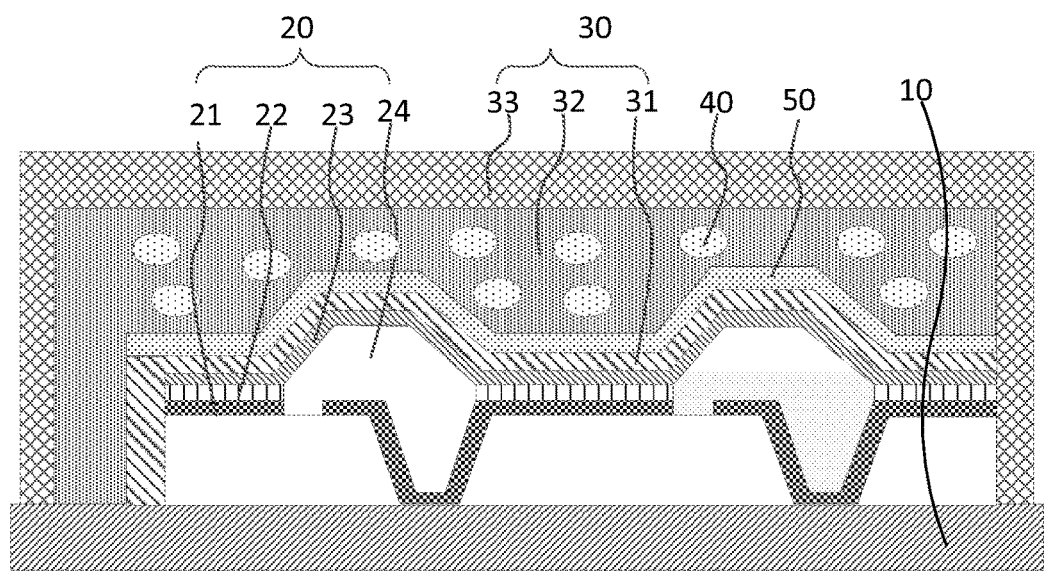
FIG. 16 is a cross sectional view of another organic light-emitting display panel according to an embodiment of the present disclosure.

FIG. 16 shows the cross sectional view of an organic light-emitting display panel, in accordance with another embodiment of the present invention. The organic light-emitting display panel of FIG. 16 is shown as including a second inorganic packaging layer 33 placed on a side of the first organic packaging layer 32 away from the array substrate 10. The second inorganic packaging layer can be made of metal oxides or non-metal oxides and the like, such as one or any combination of silicon nitride, silicon oxide, aluminum oxide, and silicon oxynitride. The second inorganic packaging layer 33 placed on a side of the first organic packaging layer 32 away from the array substrate 10 can further improve a packaging effect of the organic light-emitting display panel and prolong a usage lifetime of the organic light-emitting display panel.

Optionally, the second inorganic packaging layer can be made of one or any combination of metal oxides, non-metal oxides, nitrides, oxynitrides, and oxycarbides, such as one or any combination of aluminum oxide, titanium oxide, silicon nitride, silicon oxide, silicon oxynitride, and silicon oxycarbide.

Figure 17:
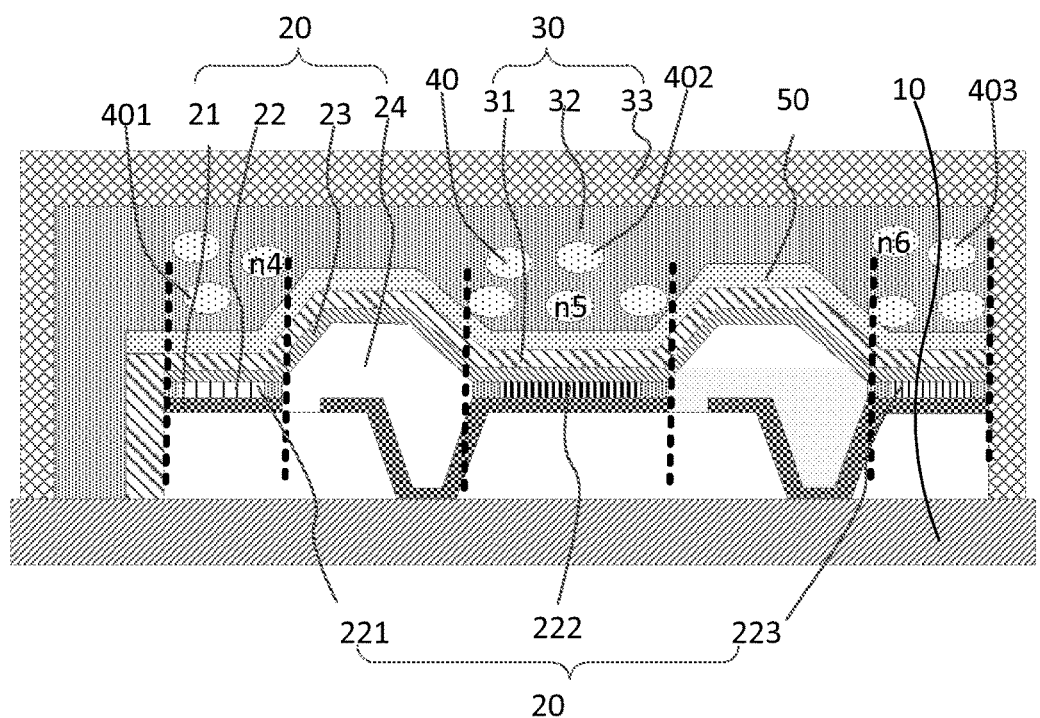
FIG. 17 is a cross sectional view of another organic light-emitting display panel according to an embodiment of the present disclosure.

FIG. 17 shows the cross sectional view of an organic light-emitting display panel, in accordance with another embodiment of the present invention. The scattering particles 40 are placed in an area corresponding to the light-emitting unit 22, a projection of the light-emitting unit 22 on the array substrate 10 is located in an area where a projection of the scattering particles 40 on the array substrate 10 is located. Optionally, the light-emitting unit 22 includes a red light-emitting unit 221, a green light-emitting unit 222, and a blue light-emitting unit 223. The scattering particles 40 correspond to the red light-emitting unit 221 and are defined as first scattering particles, and the refractive index of the first scattering particles is referred to as n4; the scattering particles 40 correspond to the green light-emitting unit 222 and are defined as second scattering particles, and the refractive index of the second scattering particles is referred to as n5; and the scattering particles 40 correspond to the blue light-emitting unit 223 and are referred to as third scattering particles, the refractive index of the third scattering particles is referred to as n6. In which n4≥n5>n6>n2, or n4≤n5<n6<n2. Therefore, more red light is scattered into a large viewing angle area to improve a red brightness at a large viewing angle and alleviate the problem that the panel tends to show a blue color at a large viewing angle. The principle is similar to that as described above, which is not repeated herein.

Figure 18:
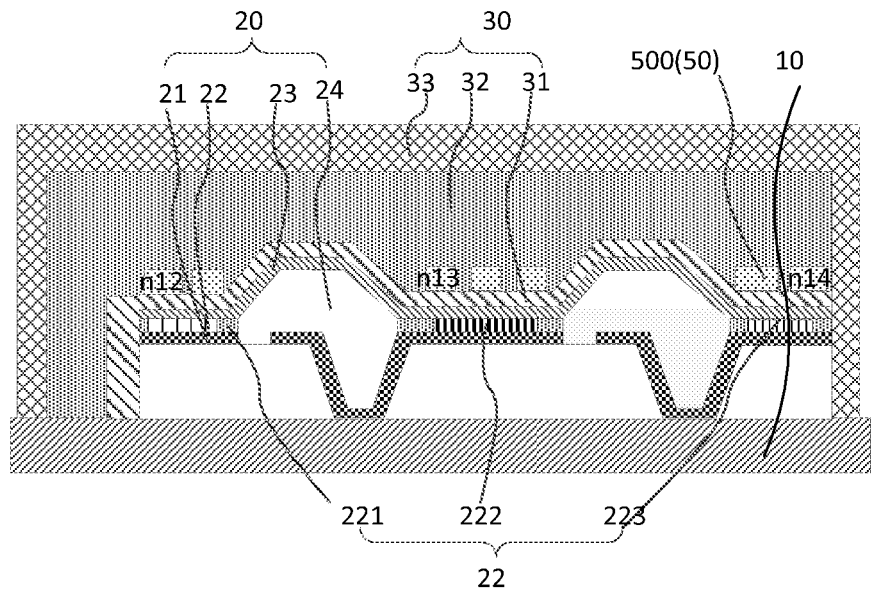
FIG. 18 is a cross sectional view of another organic light-emitting display panel according to an embodiment of the present disclosure.

FIG. 18, shows the cross sectional view of an organic light-emitting display panel, in accordance with another embodiment of the present invention. The first scattering layer 50 includes a plurality of island-shaped first scattering sub-layers 500. Adjacent island-shaped first scattering sub-layers 500 are spaced from each other. Optionally, a shape of a top view of the island-shaped first scattering sub-layer 500 includes one or any combinations of quadrangle, circle, triangle, and polygon. In the present embodiment, the first scattering layer 50 includes the plurality of island-shaped first scattering sub-layers 500, at the same time when improving the luminous efficiency, since a gap is between adjacent island-shaped first scattering sub-layers 500 and is filled with a first organic packaging layer 32, so that a pinning effect happens in the first organic packaging layer 32, thereby improving an interface contact performance between the first organic packaging layer 32 and the first inorganic packaging layer 31. Optionally, the island-shaped first scattering sub-layers 500 can correspond to the light-emitting unit 22, and a projection of the light-emitting unit 22 on the array substrate 10 is located in an area where a projection of the scattering particles on the array substrate 10 is located. The light-emitting unit 22 includes a red light-emitting unit 221, a green light-emitting unit 222, and a blue light-emitting unit 223. The refractive index of the island-shaped first scattering sub-layers 500 corresponding to the red light-emitting unit 221 is referred to as n12; the refractive index of the island-shaped first scattering sub-layers 500 corresponding to the green light-emitting unit 222 is referred to as n13; and the refractive index of the island-shaped third scattering sub-layers 500 corresponding to the green light-emitting unit 222 is referred to as n14. In which n12≥n13>n14>n1, and n1 refers to a refractive index of the first inorganic packaging layer 31. Since n12, n13, and n14 are greater than n1, when light enters into the first scattering sub-layer 500 from the first inorganic packaging layer 31, due to the fact that the light is transmitted from an optical denser medium to an optical thinner medium, thus the light is mainly reflected, so as to improve the luminous efficiency. A large amount of light is reflected at an interface between the first inorganic packaging layer 31 and the first scattering sub-layer. Therefore, more red light enters into a large viewing angle area to improve a red brightness, and keep a white balance, and thus to alleviate the problem that the panel tends to show a blue color at a large viewing angle.

Figure 19:
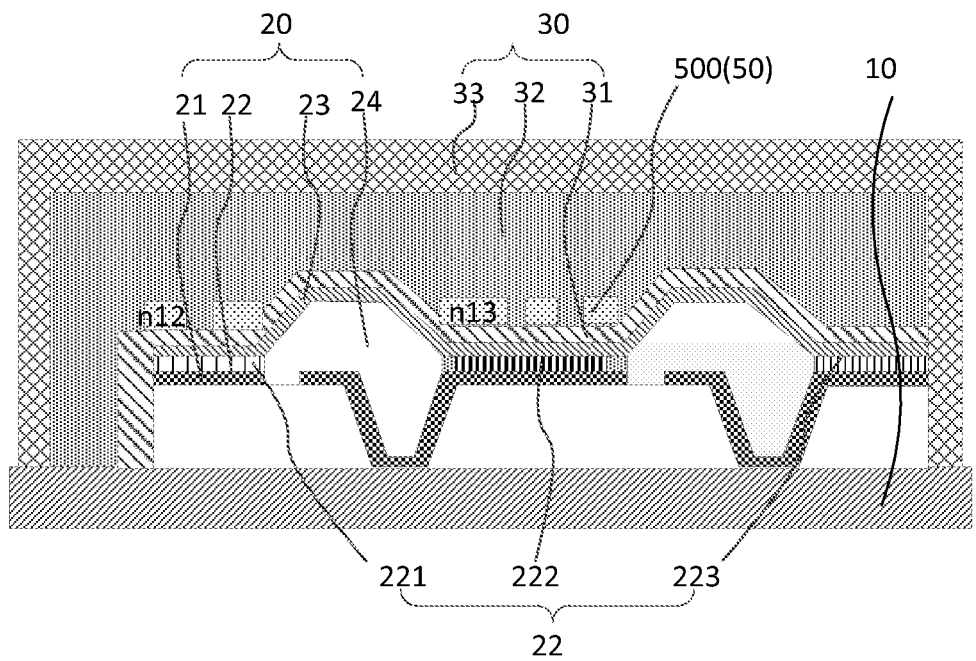
FIG. 19 is a cross sectional view of another organic light-emitting display panel according to an embodiment of the present disclosure.

FIG. 19 shows the cross sectional view of an organic light-emitting display panel, in accordance with another embodiment of the present invention. The island-shaped first scattering sub-layers 500 are placed in an area corresponding to the red light-emitting unit 221 and the green light-emitting unit 222, and projections of the red light-emitting unit 221 and the green light-emitting unit 222 on the array substrate 10 are located in an area where a projection of the island-shaped first scattering sub-layers 500 on the array substrate 10 is located. The refractive index of the island-shaped first scattering sub-layers 500 correspond to the red light-emitting unit 221 is referred as n12; the refractive index of the island-shaped first scattering sub-layers 500 correspond to the green light-emitting unit 222 is referred toasn13; and the refractive index of the first inorganic packaging layer is referred to as n1. In which n12≥n13>n1.

The present embodiment can effectively improve a red light luminous efficiency and a green light luminous efficiency, so that brightness of red light and green light is improved, brightness difference between red light and blue light is decreased, thereby keeping a white balance and alleviating the problem that the panel tends to show a blue color at a large viewing angle. The principle is similar to that as described above, which is not repeated herein.

Figure 20:
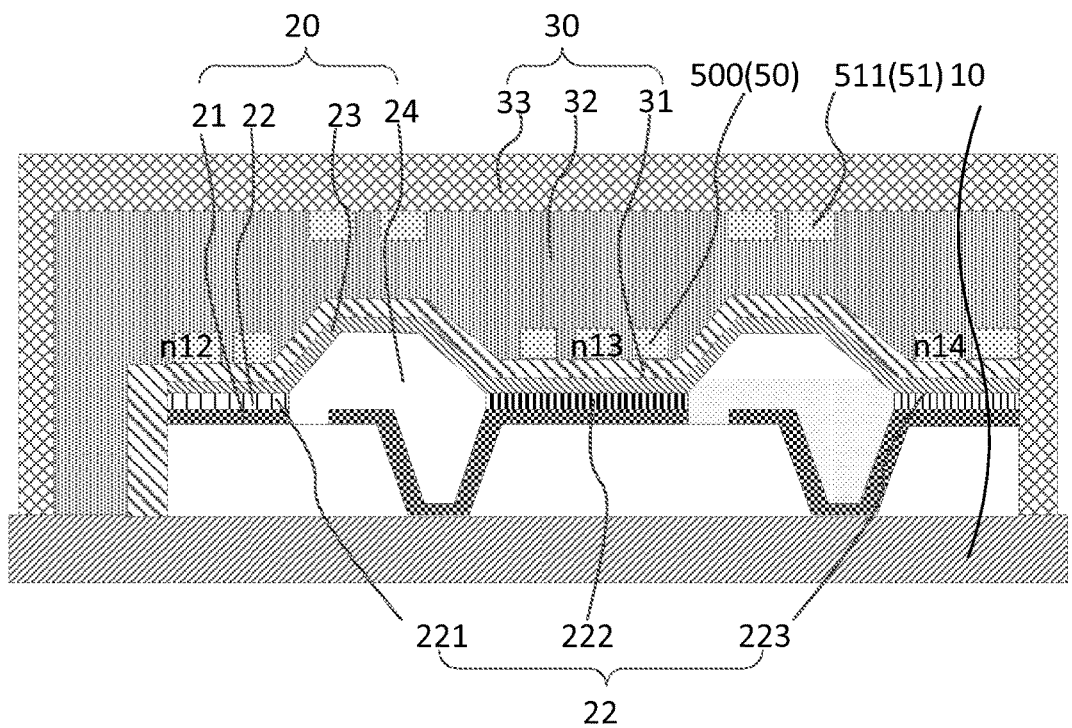
FIG. 20 is a cross sectional view of another organic light-emitting display panel according to an embodiment of the present disclosure.

FIG. 20 shows the cross sectional view of an organic light-emitting display panel, in accordance with another embodiment of the present invention. The organic light-emitting display panel shown in FIG. 20 includes a plurality of island-shaped second scattering sub-layers 511 placed on a side of the first organic packaging layer 32 away from the first inorganic packaging layer 31. A projection of the island-shaped second scattering sub-layers 511 on the array substrate does not overlap with the projection of the island-shaped first scattering sub-layers 500 on the array substrate, so that light emitted by the light-emitting unit 22 passes through a same layer to decease light refraction in different areas, and then the light output is more uniform, thereby improving a display uniformity of the organic light-emitting display panel. Other technical effects are the same as the embodiments as described above, which is not repeated herein.

Figure 21:
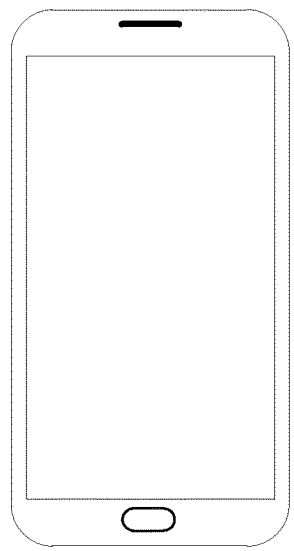
FIG. 21 is a schematic top view of an organic light-emitting display device.

FIG. 21 shows an exemplary handheld device in which an organic light-emitting display device is embodied in accordance with the present invention. The organic light-emitting display device may correspond to any one of the above described embodiments. The organic light-emitting display device may be included in a cellphone, tablet computer, wearable device, and on the like. It should be understood that, the organic light-emitting display device may further include a widely-known structure, such as a drive chip, which is not repeated herein.

The above description is merely illustrative of the preferred embodiments of the present disclosure, but is not intended to limit the present disclosure. Within the spirit and principles of the present disclosure, any modification, equivalent substitution and improvements etc., should be included within the scope of protection of the present disclosure.

What is claimed is:

1. An organic light-emitting display panel comprising:
an array substrate comprising a flexible substrate and a thin film transistor layer placed on the flexible substrate;
an organic light-emitting component layer placed on the thin film transistor layer, wherein the organic light-emitting component layer comprises a plurality of light-emitting units; and
a packaging layer positioned on the organic light-emitting component, wherein the packaging layer comprises a first inorganic packaging layer and a first organic packaging layer disposed sequentially;
wherein the first organic packaging layer comprises a plurality of scattering particles, wherein a refractive index of the first inorganic packaging layer is n1, a refractive index of the first organic packaging layer is n2, and a refractive index of the scattering particle is n3, wherein n2 is different from n3,
wherein the plurality of scattering particles is disposed over the plurality of light-emitting units, such that projections of the plurality of scattering particles overlap projections the plurality of light-emitting units on the array substrate, and
wherein the plurality of light-emitting units comprises a red light-emitting unit, a green light-emitting unit, and a blue light-emitting unit, wherein the plurality of scattering particles comprises a plurality of first scattering particles, a plurality of second scattering particles, and a plurality of third scattering particles; wherein the plurality of first scattering particles corresponds to the red light-emitting unit, wherein a refractive index of the plurality of first scattering particles is n4; wherein the plurality of second scattering particles corresponds to the green light-emitting unit, wherein a refractive index of the plurality of second scattering particles is n5; wherein the plurality of third scattering particles corresponds to the blue light-emitting unit, wherein a refractive index of the plurality of third scattering particles is n6, wherein n4>n5>n6>n2, or n4<n5<n6<n2.

2. The organic light-emitting display panel according to claim 1, wherein the packaging layer further comprises a second inorganic packaging layer positioned on the first organic packaging layer.

3. The organic light-emitting display panel according to claim 2, wherein the plurality of scattering particles is formed between an interface of the first inorganic packaging layer and the first organic packaging layer, and an interface of the first organic packaging layer and the second inorganic packaging layer.

4. An organic light-emitting display panel comprising:
an array substrate comprising a flexible substrate and a thin film transistor layer placed on the flexible substrate;
an organic light-emitting component layer placed on the thin film transistor layer, wherein the organic light-emitting component layer comprises a plurality of light-emitting units; and
a packaging layer positioned on the organic light-emitting component, wherein the packaging layer comprises a first inorganic packaging layer and a first organic packaging layer disposed sequentially;
wherein the first organic packaging layer comprises a plurality of scattering particles, wherein a refractive index of the first inorganic packaging layer is n1, a refractive index of the first organic packaging layer is n2, and a refractive index of the scattering particle is n3, wherein n2 is different from n3,
wherein the plurality of scattering particles is disposed over the plurality of light-emitting units, such that projections of the plurality of scattering particles overlap projections the plurality of light-emitting units on the array substrate,
wherein the plurality of light-emitting units comprises a red light-emitting unit and a green light-emitting unit, wherein the plurality of scattering particles is positioned over the red light-emitting unit and the green light-emitting unit, wherein projections of the scattering particles overlaps projections of the red light-emitting unit and the green light-emitting unit on the array substrate; and
wherein the plurality of scattering particles comprises a plurality of fourth scattering particles and a plurality of fifth scattering particles, wherein the plurality of fourth scattering particles corresponds to the red light-emitting unit, wherein a refractive index of the plurality of fourth scattering particles is n4; wherein the plurality of fifth scattering particles corresponds to the green light-emitting unit, wherein a refractive index of the plurality of fifth scattering particles is n5; and wherein n4≥n5>n2 or n4≤n5<n2.

5. The organic light-emitting display panel according to claim 4, wherein the packaging layer further comprises a second inorganic packaging layer positioned on the first organic packaging layer.

6. The organic light-emitting display panel according to claim 5, wherein the plurality of scattering particles is formed between an interface of the first inorganic packaging layer and the first organic packaging layer, and an interface of the first organic packaging layer and the second inorganic packaging layer.

7. An organic light-emitting display panel, comprising:
an array substrate comprising a flexible substrate and a thin film transistor layer placed on the flexible substrate;
an organic light-emitting component layer placed on the array substrate, wherein the organic light-emitting component comprises a plurality of light-emitting units; and
a packaging layer disposed on the organic light-emitting component layer, wherein the packaging layer comprises a first inorganic packaging layer, a first scattering layer and a first organic packaging layer sequentially on the array substrate;
wherein a refractive index of the first inorganic packaging layer is n1, a refractive index of the first organic packaging layer is n2, wherein a refractive index of the first scattering layer decreases in gradient along a direction from the first inorganic packaging layer to the first organic packaging layer in a range of n7 to n8, and wherein n7>n1, and n8<n2.

8. The organic light-emitting display panel according to claim 7, wherein the packaging layer further comprises a second scattering layer disposed on the first organic packaging layer, wherein a refractive index of the second scattering layer decreases in gradient along a direction from the first inorganic packaging layer to the first organic packaging layer, ranging from n9 to n10, and wherein n9>n2.

9. The organic light-emitting display panel according to claim 8, wherein the packaging layer further comprises a second inorganic packaging layer disposed on the second scattering layer, wherein a refractive index of the second inorganic packaging layer is n11, and wherein n10<n11.

10. The organic light-emitting display panel according to claim 8, wherein the first scattering layer comprises silicon oxynitride, the second scattering layer comprises silicon oxynitride, wherein an oxygen content in silicon oxynitride used in the first scattering layer and the second scattering layer increases in gradient along a direction from the first inorganic packaging layer to the first organic packaging layer.

11. The organic light-emitting display panel according to claim 7, wherein the first organic packaging layer comprises a plurality of scattering particles, wherein a refractive index of the plurality of scattering particles is different from the refractive index of the first organic packaging layer.

12. The organic light-emitting display panel according to claim 7, wherein the first scattering layer comprises a plurality of first scattering segments spaced away from each other.

13. The organic light-emitting display panel according to claim 12, wherein the plurality of first scattering segments corresponds each is associated with one unit of the plurality of light-emitting units, and wherein projections of the plurality of first scattering segments overlap projections of the plurality of light-emitting units on the array substrate.

14. The organic light-emitting display panel according to claim 12, wherein the plurality of light-emitting units comprises a red light-emitting unit, a green light-emitting unit, and a blue light-emitting unit, wherein the plurality of first scattering segments corresponding to the red light-emitting unit has a variety of refractive index smaller than n12, wherein the plurality of first scattering segments corresponding to the green light-emitting unit has a variety of refractive index smaller than n13, wherein the plurality of first scattering segments corresponding to the blue light-emitting unit has a variety of refractive index smaller than n14, and wherein n12≥n13>n14>n1.

15. The organic light-emitting display panel according to claim 12, wherein the first packaging layer further comprises a plurality of second scattering segments disposed on the first organic packaging layer, and whereon projections of the plurality of second scattering segments on the array substrate do not overlap projections of the plurality of first scattering segments on the array substrate.

16. The organic light-emitting display panel according to claim 11, wherein the plurality of scattering particles is placed over the plurality of light-emitting units, such that projections of the plurality of scattering particles overlap projections of the plurality of light-emitting units on the array substrate.

17. The organic light-emitting display panel according to claim 16, wherein the plurality of light-emitting units comprises a red light-emitting unit, a green light-emitting unit, and a blue light-emitting unit, wherein the plurality of scattering particles comprises a plurality of first scattering particles, a plurality of second scattering particles, and a plurality of third scattering particles, wherein the plurality of first scattering particles is disposed over the red light-emitting unit, and has a refractive index n4; wherein the plurality of second scattering particles is disposed over the green light-emitting unit, and has a refractive index n5; wherein the plurality of third scattering particles is disposed over the blue light-emitting unit, and has a refractive index n6, and wherein n4≥n5>n6>n2, or n4≤n5<n6<n2.

18. The organic light-emitting display panel according to claim 16, wherein the plurality of light-emitting units comprises a red light-emitting unit, a green light-emitting unit, and a blue light-emitting unit, wherein the plurality of scattering particles comprises a plurality of first scattering particles and a plurality of second scattering particles, wherein the plurality of first scattering particles is disposed over the red light-emitting unit, and has a refractive index n4; wherein the plurality of second scattering particles is disposed over the green light-emitting unit, and has a refractive index n5, and wherein n4≥n5>n2, or n4≤n5<n2.

19. The organic light-emitting display panel according to claim 11, wherein the plurality of scattering particles is selected from a group consisting of silicon nitride, silicon oxide, silicon oxynitride and combinations thereof.

20. An organic light-emitting display device, comprising an organic light-emitting display panel, wherein the organic light-emitting display panel comprises:
an array substrate, comprising a flexible substrate and a thin film transistor layer positioned on the flexible substrate;
an organic light-emitting component placed on the array substrate, the organic light-emitting component comprising a plurality of light-emitting units; and
a packaging layer positioned on a side of the organic light-emitting component away from the array substrate, the packaging layer comprising a first inorganic packaging layer, a first scattering layer and a first organic packaging layer, the first inorganic packaging layer, the scattering layer and the first organic packaging layer being positioned in order on a side of the packaging layer along a direction away from the array substrate;

wherein a refractive index of the first inorganic packaging layer is defined as n1, wherein a refractive index of the first organic packaging layer is defined as n2, wherein a refractive index of the first scattering layer decreases in gradient along a direction from the first inorganic packaging layer to the first organic packaging layer, wherein a greatest refractive index of the first scattering layer is defined as n7, wherein a smallest refractive index of the first scattering layer is defined as n8, and wherein n7>n1, and n8<n2.

* * * * *